(12) United States Patent
Seol et al.

(10) Patent No.: US 8,631,266 B2
(45) Date of Patent: Jan. 14, 2014

(54) SEMICONDUCTOR MEMORY DEVICE AND METHOD OF CONTROLLING THE SAME

(75) Inventors: Ho-Seok Seol, Daegu (KR); Young-Soo Sohn, Seoul (KR); Dong-Min Kim, Hwaseong-si (KR); Kwang-Il Park, Yongin-si (KR); Seung-Jun Bae, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 302 days.

(21) Appl. No.: 13/050,277

(22) Filed: Mar. 17, 2011

(65) Prior Publication Data

US 2011/0243289 A1 Oct. 6, 2011

Related U.S. Application Data

(60) Provisional application No. 61/320,567, filed on Apr. 2, 2010.

(30) Foreign Application Priority Data

Oct. 8, 2010 (KR) ........................ 10-2010-0098054

(51) Int. Cl.
*H04L 7/04* (2006.01)

(52) U.S. Cl.
USPC ........... 713/400; 713/401; 713/500; 713/501; 713/502; 713/503; 713/600; 713/601

(58) Field of Classification Search
USPC .................. 713/400, 401, 500–503, 600, 601
See application file for complete search history.

(56) References Cited

U.S. PATENT DOCUMENTS

| | | | |
|---|---|---|---|
| 7,236,556 B2 | 6/2007 | Ward et al. | |
| 7,558,979 B2 * | 7/2009 | Song et al. | ..................... 713/500 |
| 2006/0092717 A1 * | 5/2006 | Song et al. | .............. 365/189.05 |
| 2007/0031153 A1 * | 2/2007 | Aronson et al. | ............... 398/138 |
| 2007/0177700 A1 | 8/2007 | Saeki | |
| 2009/0271652 A1 * | 10/2009 | Song et al. | .................... 713/503 |

FOREIGN PATENT DOCUMENTS

| | | |
|---|---|---|
| JP | 2007-208616 | 8/2007 |
| KR | 10-2008-0095676 | 10/2008 |

* cited by examiner

*Primary Examiner* — M Elamin
(74) *Attorney, Agent, or Firm* — Onello & Mello, LLP (57) ABSTRACT

A method of tuning a phase of a clock signal includes performing data training on a plurality of data pins through which data are input and output, in synchronization with a data clock signal; determining one of the data pins to be a representative pin; performing clock and data recovery (CDR) on read data of the representative pin; and adjusting a phase of the data clock signal based on the CDR.

14 Claims, 8 Drawing Sheets

SEMICONDUCTOR MEMORY DEVICE AND METHOD OF CONTROLLING THE SAME

CROSS-REFERENCE TO RELATED APPLICATION(S)

This US non-provisional application claims the benefit of priority under 35 USC §119 to U.S. Provisional Application No. 61/320,567 filed on Apr. 2, 2010 in the USPTO, and Korean Patent Application No. 10-2010-0098054 filed on Oct. 8, 2010 in the Korean Intellectual Property Office (KIPO), the contents of which applications are herein incorporated by reference in their entirety.

BACKGROUND OF THE INVENTION

1. Technical Field

Exemplary embodiments relate to semiconductor devices and methods of tuning phase of a data clock signal, and memory controllers and memory systems using the same.

2. Description of the Related Art

Recently, operating speeds of semiconductor memory devices have become increasingly fast. As a result of the increased operating speed, phase mismatches between output data and data clock signals occur more frequently. Data training or clock and data recovery (CDR) is used in the semiconductor memory devices to remedy these phase mismatches.

SUMMARY OF THE INVENTION

The inventive concept is provided to substantially obviate one or more drawbacks due to limitations and disadvantages of the related art.

Some exemplary embodiments provide a method of adjusting phase of a clock signal, capable of maintaining system characteristics.

Some exemplary embodiments provide a method of controlling the semiconductor memory device.

According to one aspect, the inventive concept is directed to a method of tuning a phase of a clock signal. The method includes performing data training on a plurality of data pins through which data are input and output, in synchronization with a data clock signal; determining one of the data pins to be a representative pin; performing clock and data recovery (CDR) on read data of the representative pin; and adjusting a phase of the data clock signal based on the CDR.

In some embodiments, performing the CDR may include sampling an edge of the read data to determine a sampled edge of the read data; detecting a phase difference of the sampled edge of the read data and the data clock signal; and adjusting the phase of the data clock signal according to the detected phase difference.

The phase of the data clock signal may be adjusted by synchronizing the data clock signal with the sampled edge of the read data.

Adjusting the phase of the data clock signal may include converting the detected phase difference to phase information; and selecting one of a plurality of interpolated clock signals according to the phase information, each of the plurality of interpolated clock signals having a same frequency as the data clock signal, the plurality of interpolated clock signals having regular phase differences with respect to each other.

Adjusting the phase of the data clock signal may include converting the detected phase difference to phase information; and calculating a plurality of interpolated clock signals using weights determined according to the phase information, each of the interpolated clock signals having a same frequency as the data clock signal, the plurality of interpolated clock signals having regular phase differences with respect to each other.

In some embodiments, the data clock signal may be one of a write clock signal and a data strobe signal.

According to another aspect, the inventive concept is directed to a memory controller which includes a sampler, a decoder and a phase interpolator. The sampler samples an edge of read data from a representative pin selected from a plurality of data pins, such that a sampled edge of the read data is determined. The decoder decodes a phase difference between the sampled edge and a data clock signal to provide phase information. The phase interpolator adjusts a phase of the data clock signal according to the phase information.

In some embodiments, the decoder may include a phase detector that detects the phase difference between the sampled edge of the read data and the data clock signal; and a converter that converts the phase difference to the phase information.

The phase difference may be digital value.

In some embodiments, the phase interpolator may include a clock generator that generates a plurality of interpolated clock signals, each of the plurality of interpolated clock signals having a same frequency as the data clock signal, the plurality of interpolated clock signals having regular phase differences with respect to each other. The phase interpolator may also include a selection unit that selects one of the interpolated clock signals in response to the phase information to provide a corrected data clock signal.

In some embodiments, the phase interpolator may include a clock generator that generates a plurality of interpolated clock signals, each of the plurality of interpolated clock signals having a same frequency as the data clock signal, the plurality of interpolated clock signals having regular phase differenced with respect to each other, a weight generator that generates a weight for each of the interpolated clock signals in response to the phase information and a phase mixer that sums and averages the interpolated clock signals in response to the generated weights to provide the corrected data clock signal.

The phase mixer may include a plurality of n-type metal oxide semiconductor (NMOS) transistors that receive the weights and the interpolated clock signals.

The weight may correspond to current.

The phase mixer may comprise a plurality of differential input units.

According to another aspect, the inventive concept is directed to a memory system which includes a memory device, and a memory controller which exchanges data with the memory device through a plurality of data pins in synchronization with a data clock signal, and controls the memory device. The memory controller includes a sampler that samples an edge of read data from a representative pin selected from the data pins, such that a sampled edge of the read data is determined, a decoder configured to decode a phase difference between the sampled edge of the read data and a data clock signal to provide phase information. The memory system further includes a phase interpolator configured to adjust a phase of the data clock signal according to the phase information.

In some embodiments, the memory device may include a memory cell array that stores the data, a refresh controller that controls refresh operation of the memory cell array, and a first in first out (FIFO) that stores predefined patterns. The refresh controller may control the memory cell array such that the predefined patterns are transmitted to the memory controller through the representative pin after the refresh operation of the memory cell array is completed.

According to another aspect, the inventive concept is directed to a method of controlling a memory. The method includes sampling an edge of read data from a representative pin selected from a plurality of data pins used in communicating with the memory, such that a sampled edge of the read data is determined; decoding a phase difference between the sampled edge and a data clock signal to provide phase information; and adjusting a phase of the data clock signal according to the phase information.

The method may further include performing data training on the plurality of data pins through which data are communicated with the memory, in synchronization with a data clock signal; and determining one of the data pins to be the representative pin.

In some embodiments, adjusting the phase of the data clock signal comprises: converting the detected phase difference to the phase information; and selecting one of a plurality of interpolated clock signals according to the phase information to provide a corrected data clock signal, each of the plurality of interpolated clock signals having a same frequency as the data clock signal, the plurality of interpolated clock signals having regular phase differences with respect to each other.

In some embodiments, adjusting the phase of the data clock signal comprises: converting the detected phase difference to the phase information; and calculating a plurality of interpolated clock signals using weights, the weights being determined according to the phase information, each of the interpolated clock signals having a same frequency as the data clock signal, the plurality of interpolated clock signals having regular phase differences with respect to each other.

In the exemplary embodiments, the system characteristics may be prevented from being degraded by using the detected phase difference between the data clock signal and the read data in adjusting phase of the data clock signal.

BRIEF DESCRIPTION OF THE DRAWINGS

The foregoing and other features and advantages of the inventive concept will be apparent from the more particular description of preferred embodiments of the inventive concept, as illustrated in the accompanying drawings in which like reference characters refer to the same parts throughout the different views. The drawings are not necessarily to scale, emphasis instead being placed upon illustrating the principles of the inventive concept.

DETAILED DESCRIPTION

Various exemplary embodiments will be described more fully hereinafter with reference to the accompanying drawings, in which some exemplary embodiments are shown. The present inventive concept may, however, be embodied in many different forms and should not be construed as limited to the exemplary embodiments set forth herein. Rather, these exemplary embodiments are provided so that this description will be thorough and complete, and will fully convey the present inventive concept to those skilled in the art. In the drawings, the sizes and relative sizes of layers and regions may be exaggerated for clarity. Like reference numerals refer to like elements throughout.

It will be understood that, although the terms first, second, third, etc., may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular exemplary embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Figure 1:
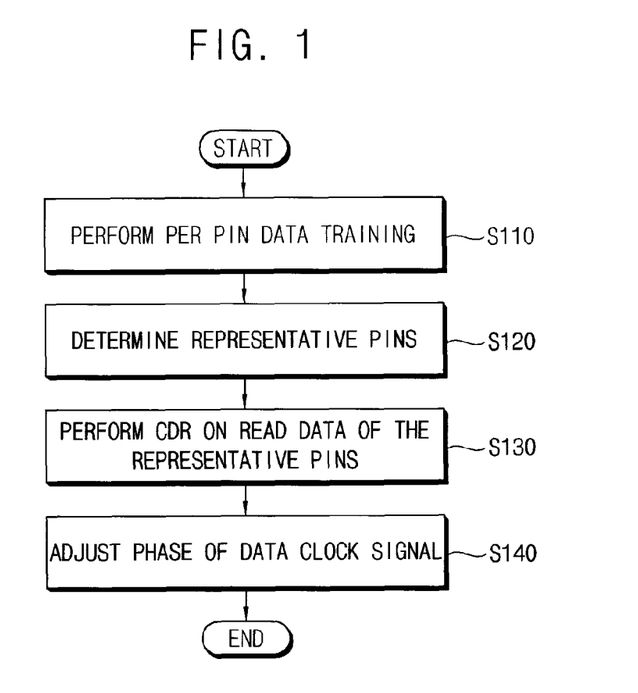
FIG. 1 is a flow chart illustrating a method of tuning a phase of a clock signal, according to some exemplary embodiments.

FIG. 1 is a flow chart illustrating a method of tuning a phase of a clock signal according to some exemplary embodiments.

Figure 6:
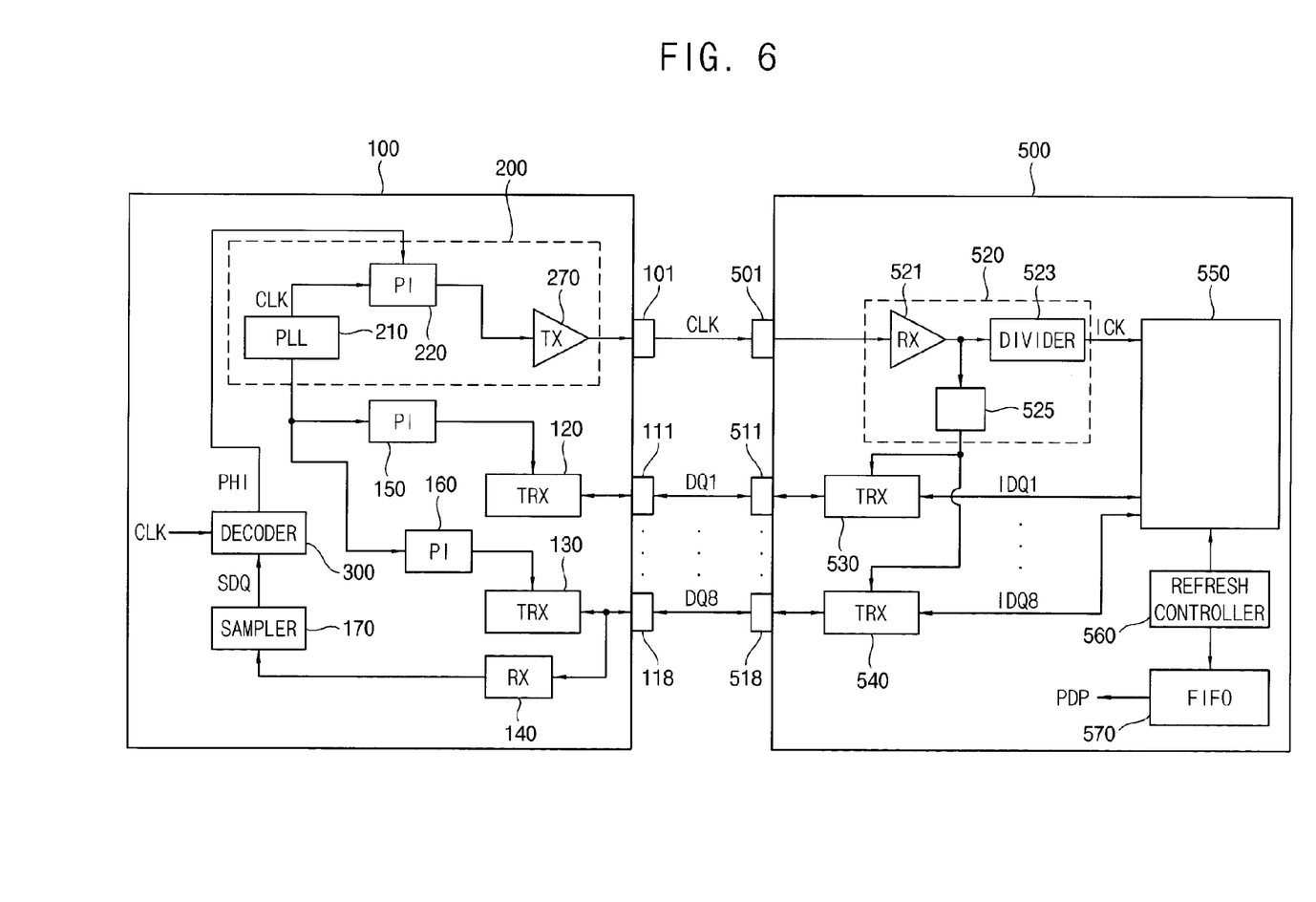
FIG. 6 is a schematic block diagram illustrating the memory system of FIG. 4 in detail, according to some exemplary embodiments.

FIG. 6 is a block diagram illustrating a memory system according to some exemplary embodiments.

Hereinafter, a method of tuning a phase of a clock signal will be described in detail with reference to FIGS. 1 and 6. FIG. 6 is described in further detail below. However, FIG. 6 is referred to here in order to facilitate detailed description of the method according to the inventive concept illustrated in the flow chart of FIG. 1.

Referring to FIGS. 1 and 6, in step S110 of the method, per pin data training is performed on read data DQ1~DQ8 output through a plurality of data pins 111~118, respectively, and 511~518, respectively. The per pin data training is performed when the memory system 10 is initialized.

In step S120, a pair of representative pins is identified from among the data pins 111~118 and 511~518, according to the result of the performed data training. In this illustrative exemplary embodiment, the identified representative pins are pins 118 and 518. When the data training is performed, phase difference information for each pair of the data pins 111~118 and 511~518 may be obtained. A pair of pins that is determined to have a phase difference information similar to an average value of phase differences of the pairs of the data pins 111~118 and 511~518 may be determined to be the pair of representative pins. As noted above, in this illustrative exemplary embodiment, the pins 118 and 518 are determined to be the representative pins.

After the pair of representative pins is determined, the memory controller 100 and the memory device 500 perform normal operations. When the memory device 500 performs the normal operation, temperature of the memory device 500 rises, and operating voltage of the memory device 500 changes. When the temperature of the memory device 500 rises and operating voltage of the memory device 500 changes, skews between the read data from the memory device 500 and the data clock signal CLK occur. As a result, in step S130, clock and data recovery (CDR) is performed on the read data DQ8 from the representative pins 118 and 518. In step S140, phase of the data clock signal CLK is adjusted according to the CDR. That is, the phase of the data clock signal CLK is synchronized with the read data DQ8 based on the CDR.

Figure 2:
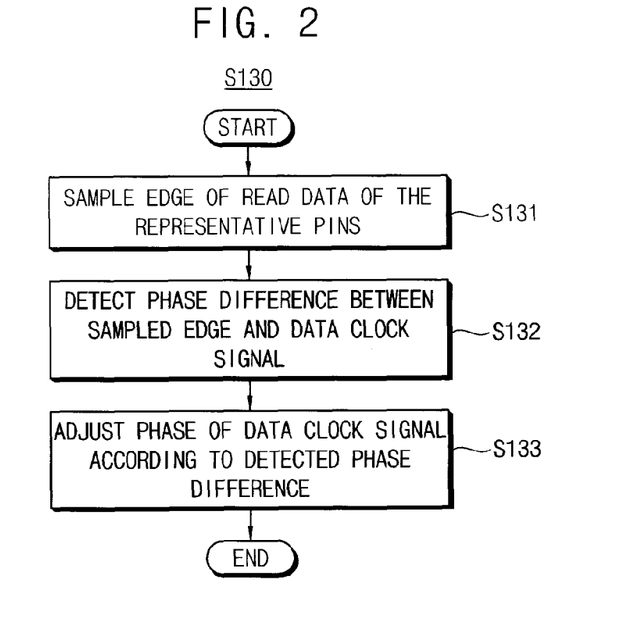
FIG. 2 is a flow chart illustrating step S130 of FIG. 1 in detail, according to some exemplary embodiments.

FIG. 2 is a flow chart illustrating the step S130 of FIG. 1 in detail, according to some exemplary embodiments. That is, FIG. 2 is a flow chart illustrating steps in performing CDR on read data DQ8 of the identified representative pins.

Referring to FIG. 2, in step S131, an edge of the read data DQ8 is sampled using a sampler 170 as illustrated in FIG. 6. In step S132, a phase difference between the sampled edge and the data clock signal CLK is detected. In step S133, the phase of the data clock signal CLK is adjusted according to the detected phase difference.

Figure 3:
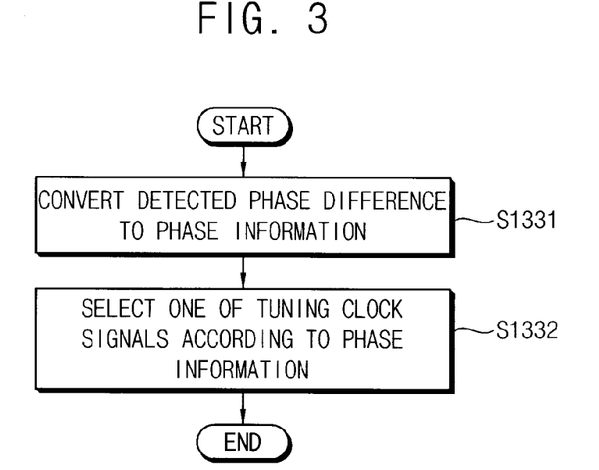
FIG. 3 is a flow chart illustrating the step S133 of FIG. 2 in detail, according to some exemplary embodiments.

FIG. 3 is a flow chart illustrating the step S133 of FIG. 2 in detail, according to some exemplary embodiments. That is, FIG. 3 is a flow chart illustrating steps in adjusting phase of the data clock signal CLK according to the detected phase difference.

Referring to FIG. 3, in step S1331, the detected phase difference is converted to phase information PHI using a decoder 300 as illustrated in FIG. 6. In step S1332, one of a plurality of interpolated clock signals (CLK1~CLKn in FIG. 8) is selected according to the phase information PHI using a phase interpolator 220 as illustrated in FIG. 6, and the selected one of the interpolated clock signals (CLK1~CLKn in FIG. 8) is provided as a corrected data clock signal CCLK (S1332). Each of the interpolated clock signals (CLK1~CLKn in FIG. 8) may have the same frequency as the data clock signal CLK and may have a regular phase difference with respect to each other.

Figure 4:
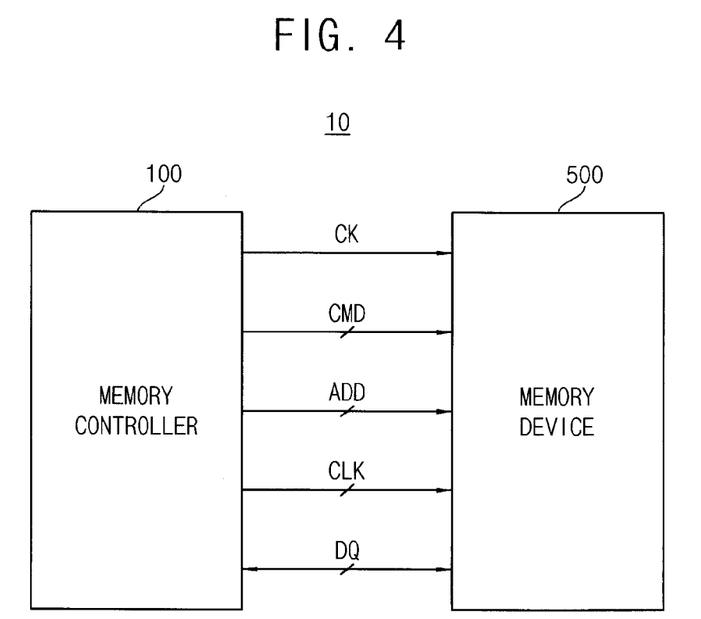
FIG. 4 is a schematic block diagram illustrating a memory system, according to some exemplary embodiments.

FIG. 4 is a schematic block diagram illustrating a memory system 10 according to some exemplary embodiments.

Referring to FIG. 4, the memory system 10 includes a memory controller 100 connected to and in communication with a memory device 500. The memory controller 100 transmits a command CMD and an address ADD in response to a clock signal CK. The memory controller 100 transmits data DQ in response to the data clock signal CLK. The frequency of the data clock signal CLK is higher that the frequency of the clock signal CK. The memory device 500 receives the command CMD and the address ADD in response to the clock signal CK, receives the data DQ in response to the data clock signal CLK, and outputs the data DQ in response to the data clock signal CLK. The data clock signal CLK may be one of a write clock signal WCK and a data strobe signal DQS.

Figure 5:
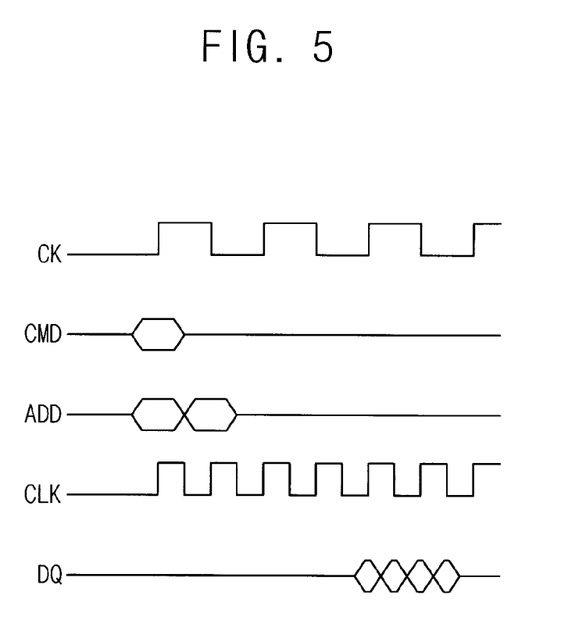
FIG. 5 is a schematic timing diagram illustrating the operation of the memory system of FIG. 4, according to some exemplary embodiments.

FIG. 5 is a schematic timing diagram illustrating the operation of the memory system of FIG. 4, according to some exemplary embodiments.

In FIG. 5, the memory controller 100 writes the data DQ into the memory device 500 at a double data rate. Write latency corresponds to three clock cycles, and burst length corresponds to four.

Referring to FIG. 5, the command CMD and address ADD are transmitted in response to the clock signal CK, and the data DQ is transmitted in response to rising and falling edges of the data clock signal CLK which is synchronized with the clock signal CK and, as illustrated in this exemplary embodiment, has double the frequency of the clock signal CK. Therefore, the memory system 10 of FIG. 4 is capable of transmitting four data through one data transmission line in one clock cycle of the clock signal CK. In addition, since the data clock signal CLK is always generated in the normal operation as the clock signal CK, a problem such as the write clock signal being inexactly generated is eliminated.

FIG. 6 is a schematic block diagram illustrating the memory system 10 of FIG. 4 in detail according to some exemplary embodiments.

In FIG. 6, pins 101 and 501 associated with the data clock signal CLK and pins 111~118 and 511~518 associated with the data DQ1~DQ8 in FIG. 5 are illustrated.

Referring to FIG. 6, the memory controller 100 transmits the data clock signal CLK through the pin 101, and the memory device 500 receives the data clock signal CLK through the pin 501. The memory controller 100 and the memory device 500 exchange each of the data DQ1~DQ8 through each pair of the pins 111~118 and 511~518, respectively.

The memory controller 100 may include a transmitter 270, transceivers 120 and 130, a receiver 140, a sampler 170, a decoder 300, a clock generator 210 and phase interpolators 220, 150 and 160. The clock generator 210, which can include a phase-locked loop (PLL), generates the data clock signal CLK. The transmitter 270 transmits the data clock signal CLK through the pin 101. Each of the transceivers 120 and 130 transmits/receives each of the data DQ1 and DQ8, respectively, through each of the pins 111 and 118, respectively.

The memory device 500 may include a receiver 521, a divider 523, a clock distributor 525, transceivers 530 and 540, a memory cell array 550, a refresh controller 560 and a first-in and first-out (FIFO) circuit 570. The receiver 521, divider 523 and clock distributor 525 constitute clock processing circuitry 520. The receiver 521 receives the data clock signal CLK through the pin 501. The divider 523 divides the data clock signal CLK to provide an internal clock signal ICK to the memory cell array 550. The clock distributor 525 distributes the data clock signal CLK to the transceivers 530 and 540. Each of the transceivers 530 and 540 receives/transmits each of the data DQ1 and DQ8 through each of the pins 511 and 518 in synchronization with the data clock signal CLK. The memory cell array 550 and the transceivers 530 and 540 exchange internal data IDQ1 and IDQ8. The refresh controller 560 controls refresh operation of the memory cell array 550 such that predefined patterns PDP are transmitted to the memory controller 100 via the FIFO circuit 570 through the pin 518 after the refresh operation of the memory cell array 550 is completed.

The memory controller 100 performs data training on each pair of the data pins 111~118 and 511~518 during the initializing operation of the memory device 500, and then determines a pair of representative pins. In this illustrative exemplary embodiment, the pins 118 and 518 are determined to be the pair of representative pins. One pair of the representative pins is determined from the pairs of the data pins 111~118 and 511~518 based on the training result. When the data training is performed, each phase difference information of each pair of the data pins 111~118 and 511~518 may be obtained. A pair of pins having a phase difference information similar to an average value of phase differences of the pairs of the data pins 111~118 and 511~518 may be determined to be the pair of representative pins.

The memory controller 100 controls the memory device 500 such that the memory device 500 performs normal write and read operations. When the memory device 500 performs normal operations, temperature of the memory device 500 rises, and operating voltage of the memory device 500 changes. When the temperature of the memory device 500 rises, and operating voltage of the memory device 500 changes, skews between the read data from the memory device 500 and the data clock signal CLK occur. These skews occur substantially in each pair of the data pins 111~118 and 511~518. These skews may degrade performance of the memory system 10.

Accordingly, clock and data recovery (CDR) is performed on the read data DQ8 from the representative pins 118 and 518 (step S130) to remove the skews. More specifically, the receiver 140 receives the read data DQ8 from the representative pins 118 and 518, and transmits the read data DQ8 to the sampler 170. The sampler 170 samples the edge of the read data DQ8. The decoder 300 decodes a phase difference between the edge of the sampled data SDQ and the data clock signal CLK to provide phase information PHI. The phase interpolator 220 receives the phase information PHI and adjusts a phase of the data clock signal CLK according to the phase information PHI. More specifically, the phase interpolator 220 synchronizes the data clock signal CLK with the read data DQ8.

Figure 7:
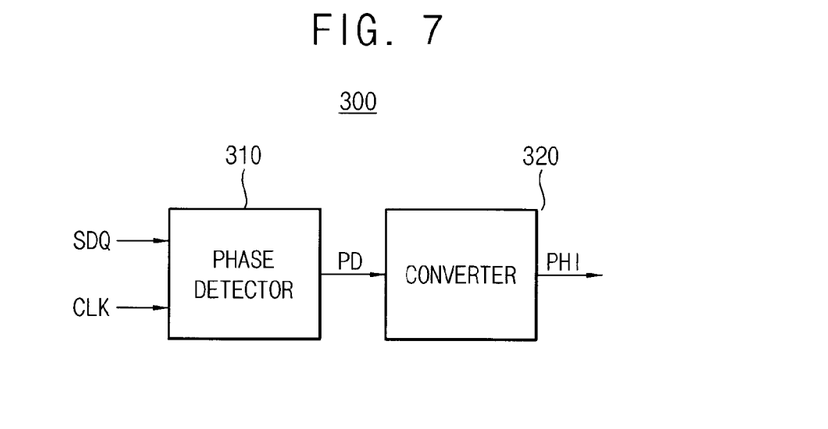
FIG. 7 is a schematic block diagram illustrating an example of the decoder in FIG. 6, according to some exemplary embodiments.

FIG. 7 is a schematic block diagram illustrating an example of the decoder 300 in FIG. 6, according to some exemplary embodiments.

Referring to FIG. 7, the decoder 300 may include a phase detector 310 and a converter 320.

The phase detector 310 detects a phase difference PD between the edge of the sampled data SDQ and the data clock signal CLK. The converter 320 converts the detected phase difference PD to the phase information PHI. The phase information PHI may be digital values (or digital codes). The converter 320 includes a table storing digital codes corresponding to the phase difference PD, and may output the phase information PHI corresponding to the phase difference PD. Table 1 below illustrates a table which may be included in the converter 320. Table 1 illustrates one exemplary embodiment of the digital codes of the phase information PHI, according to the phase difference PD in degrees.

TABLE 1

| PD (degree) | PHI (digital) |
|---|---|
| 0 | 000 |
| 45 | 001 |
| 90 | 010 |
| 135 | 011 |
| 180 | 100 |
| 225 | 101 |
| 270 | 110 |
| 315 | 111 |

Figure 8:
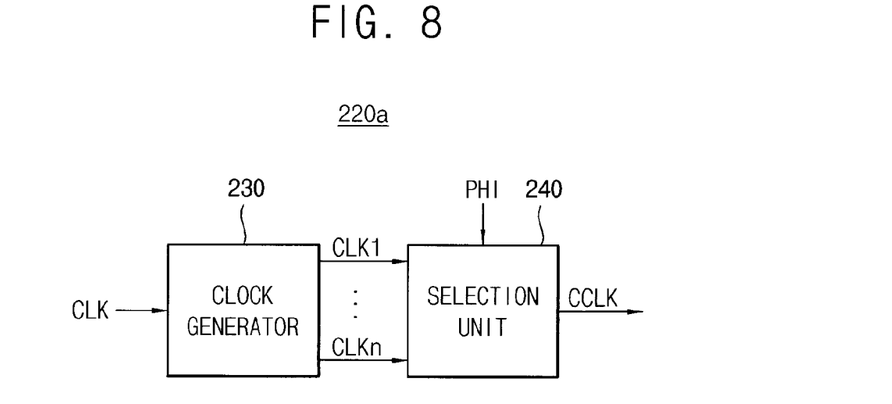
FIG. 8 is a schematic block diagram illustrating an example of the phase interpolator in FIG. 6, according to some exemplary embodiments.

FIG. 8 is a schematic block diagram illustrating an example of the phase interpolator in FIG. 6 according to some exemplary embodiments.

Referring to FIG. 8, a phase interpolator 220a may include a clock generator 230 and a selection unit 240. In response to the clock signal CLK, the clock generator 230 generates a plurality of interpolated clock signals CLK1~CLKn, each having the same frequency as the data clock signal CLK and having a regular phase difference with respect to each other. The selection unit 240 selects one of the interpolated clock signals CLK1~CLKn to be output as a corrected data clock signal CCLK according to the phase information PHI. In one particular embodiment, the selection unit 240 may be a multiplexer having a control terminal that receives the phase information PHI. The memory controller 100 and the memory device 500 may exchange data DQ1~DQ8 in synchronization with the corrected clock signal CCLK.

Figure 9:
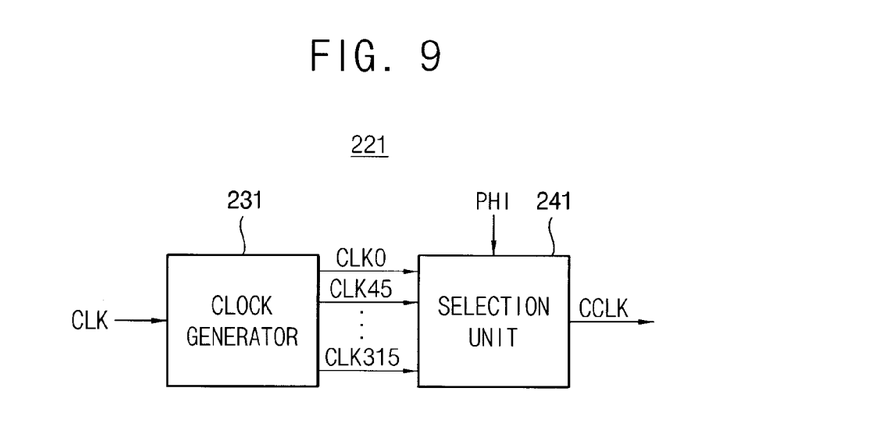
FIG. 9 is a schematic block diagram illustrating an example of the phase interpolator of FIG. 8, according to some exemplary embodiments.

FIG. 9 is a schematic block diagram illustrating a specific example of the phase interpolator of FIG. 8 according to some exemplary embodiments.

Referring to FIG. 9, a phase interpolator 221 may include a clock generator 231 and a selection unit 241. The clock generator 231 generates a plurality of interpolated clock signals CLK0, CLK45, . . . , CLK315, each having the same frequency as the data clock signal CLK and having a regular phase difference (45 degree) with respect to each other in response to the data clock signal CLK. The selection unit 241 selects one of the interpolated clock signals CLK0, CLK45, CLK315 to be output as a corrected data clock signal CCLK according to the phase information PHI.

In FIG. 9, the regular phase difference of the interpolated clock signals CLK1~CLKn is 45 degrees for example. In another example, the regular phase difference of the interpolated clock signals CLK1~CLKn is 60 degrees or 90 degrees.

Figure 10:
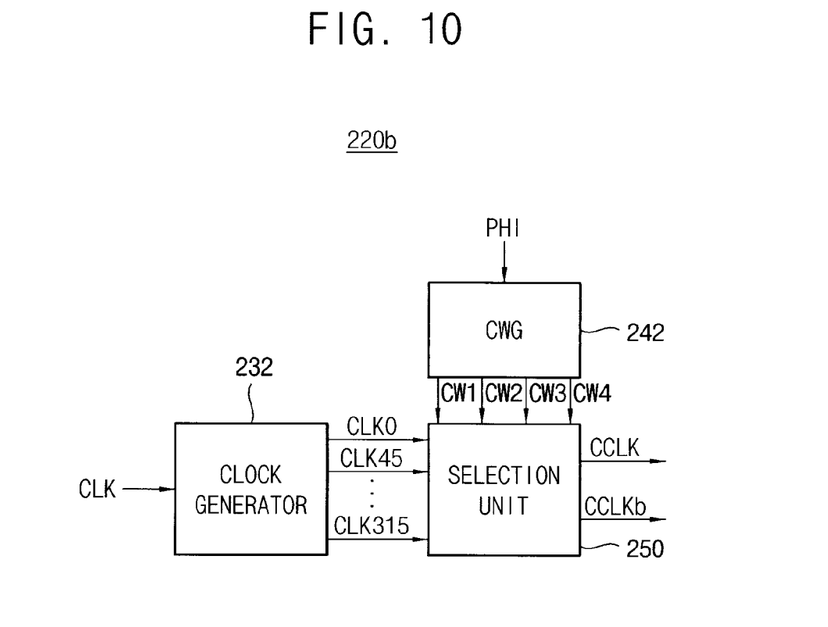
FIG. 10 is a schematic block diagram illustrating an example of the phase interpolator in FIG. 6, according to some exemplary embodiments.

FIG. 10 is a block diagram illustrating a specific example of the phase interpolator in FIG. 6 according to other exemplary embodiments.

Referring to FIG. 10, a phase interpolator 220b may include a clock generator 232, a weight generator 242 and a phase mixer 250.

The clock generator 232 generates a plurality of interpolated clock signals CLK0, CLK45, . . . , CLK315, each having the same frequency as the data clock signal CLK and having a regular phase difference (45 degrees) with respect to each other. The weight generator 242 generates the weights CW1, CW2, CW3 and CW4 of the interpolated clock signals CLK0, CLK45, CLK315 in response to the phase information PHI. The phase mixer 250 sums and averages the interpolated clock signals CLK0, CLK45, CLK315 according to the weights CW1, CW2, CW3 and CW4 to provide the corrected data clock signals CCLK and CCLKb. In some embodiments, the weights CW1, CW2, CW3 and CW4 may be current.

Figure 11:
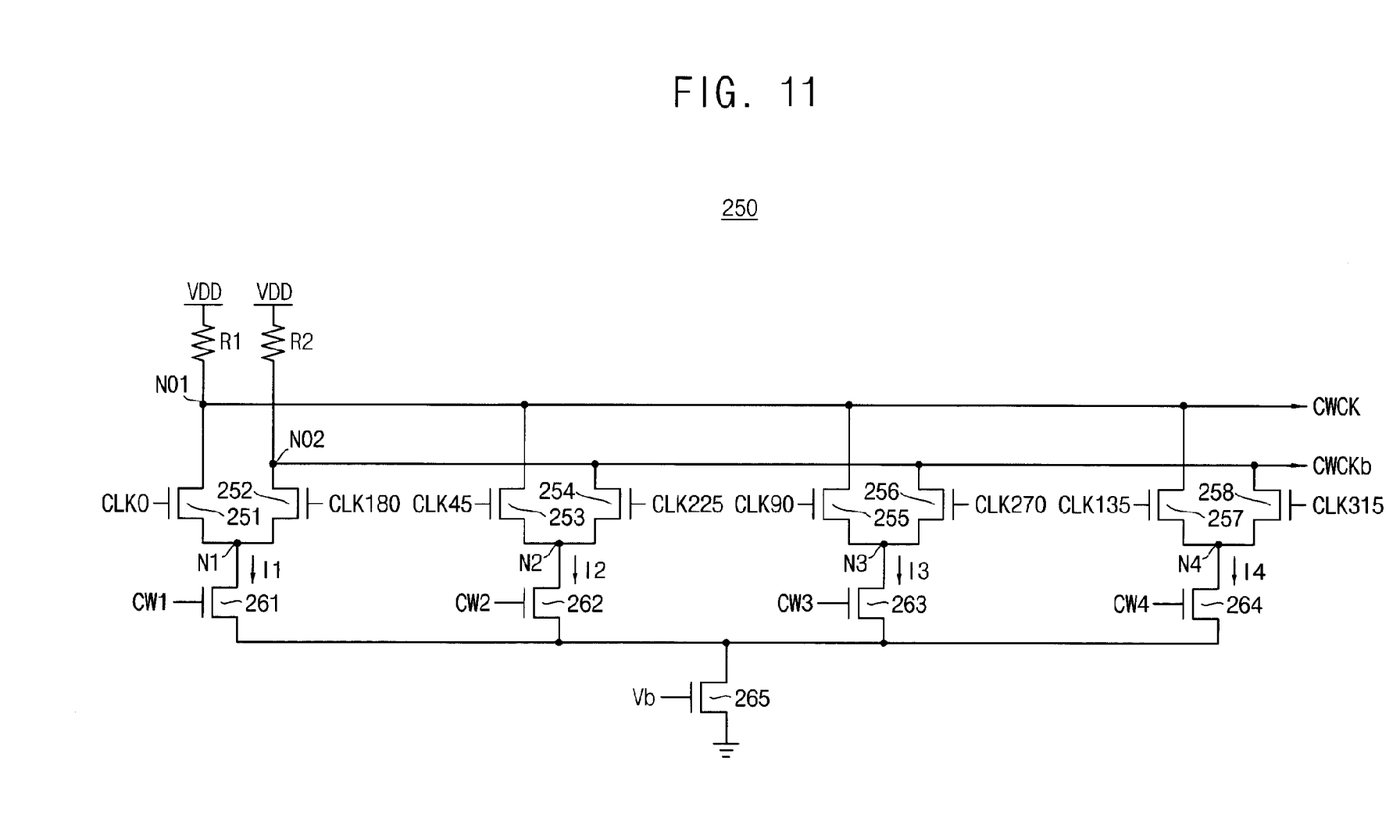
FIG. 11 is a schematic block diagram illustrating an example of the phase mixer in FIG. 10, according to some exemplary embodiments.

FIG. 11 is a schematic block diagram illustrating an example of the phase mixer in FIG. 10 according to other exemplary embodiments.

Referring to FIG. 11, a phase mixer 250 includes n-type metal oxide semiconductor (NMOS) transistors 251~258 and 261~264, and resistors R1 and R2.

The phase mixer 250 is structured in the form of four differential input units responding to selected pairs of the four interpolated clock signals CLK0 and CLK180, CLK45 and CLK225, CLK90 and CLK270 and CLK135 and CLK315.

The first differential input unit includes resistors R1 and R2, and NMOS transistors 251 and 252. The resistor R1 is connected between the driving voltage VDD and an output node NO1. The NMOS transistor 251 has a drain coupled to the output node NO1 and a source connected to a node N1. The resistor R2 is connected between the driving voltage VDD and the output node NO2. The NMOS transistor 252 has a drain coupled to the output node NO2 and a source connected to the node N1. The NMOS transistor 251 responds to the interpolated clock signal CLK0 through its gate, while the NMOS transistor 252 responds to the interpolated clock signal CLK180 through its gate.

The second differential input unit includes resistors R1 and R2, and NMOS transistors 253 and 254. The NMOS transistor 253 has a drain coupled to the output node NO1 and a source connected to a node N2. The NMOS transistor 254 has a drain coupled to the output node NO2 and a source connected to the node N2. The NMOS transistor 253 responds to the interpolated clock signal CLK45 through its gate, while the NMOS transistor 254 responds to the clock signal CLK225 through its gate.

The third differential input unit includes resistors R1 and R2, and NMOS transistors 255 and 256. The NMOS transistor 255 has a drain coupled to the output node NO1, and a source connected to a node N3. The NMOS transistor 256 has a drain coupled to the output node NO2 and a source connected to the node N 3. The NMOS transistor 255 responds to the interpolated clock signal CLK90 through its gate, while the NMOS transistor 256 responds to the clock signal CLK270 through its gate.

The fourth differential input unit includes resistors R1 and R2, and NMOS transistors 257 and 258. The NMOS transistor 257 has a drain coupled to the output node NO1 and a source connected to a node N 4. The NMOS transistor 258 has a drain coupled to the output node NO2 and a source connected to the node N 4. The NMOS transistor 257 responds to the interpolated clock signal CLK135 through its gate, while the NMOS transistor 258 responds to the interpolated clock signal CLK315 through its gate.

The phase mixer also includes the NMOS transistors 261, 262, 263, 264 and 265. The NMOS transistor 261 is connected to the first differential input unit at the node N1, has a gate receiving the weight CW1 and determines a first current I1 flowing through the first differential input unit. The NMOS transistor 262 is connected to the second differential input unit at the node N2, has a gate receiving the weight CW2 and determines a second current I2 flowing through the second differential input unit. The NMOS transistor 263 is connected to the third differential input unit at the node N3, has a gate receiving the weight CW3 and determines a third current I3 flowing through the third differential input unit. The NMOS transistor 264 is connected to the fourth differential input unit at the node N4, has a gate receiving the weight CW4 and determines a fourth current I4 flowing through the fourth differential input unit. The NMOS transistor 265 is connected between the sources of the NMOS transistors 261, 262, 263 and 254 and the ground, and has a gate receiving a bias voltage Vb. The total current flowing through the first and fourth differential input units is determined according to the bias voltage Vb. The total current flowing through the first and fourth differential input units is regular. The total current It is obtained from Expression 1.

$$It = I1 + I2 + I3 + I4 \quad \text{[Expression 1]}$$

Therefore, the corrected data clock signal CCLK may be obtained from Expression 2.

$$CCLK = (I1*CLK0 + I2*CLK45 + I3*CLK90 + I4*CLK135)/(I1 + I2 + I3 + I4)$$

Therefore, a phase of the corrected data clock signal CCLK may be determined according to the currents I1~I4 that are generated based on the weights CW1~CW4 corresponding to the phase information PHI.

For example, when the corrected data clock signal CCLK is required to have a phase of 30 degrees, the interpolated clock signals CLK0 and CLK45 may be mixed with a ratio of 1:2. Therefore, the weight generator 242 controls the weights CW1~CW4 such that the current I2 is generated to be two times more than the current I1.

The table 2 below illustrates the phase difference and the corresponding currents in FIG. 10.

TABLE 2

| PD (degree) | I1, I2, I3, I4 |
| --- | --- |
| 30 | 1, 2, 0, 0 |
| 60 | 0, 2, 1, 0 |

Figure 12:
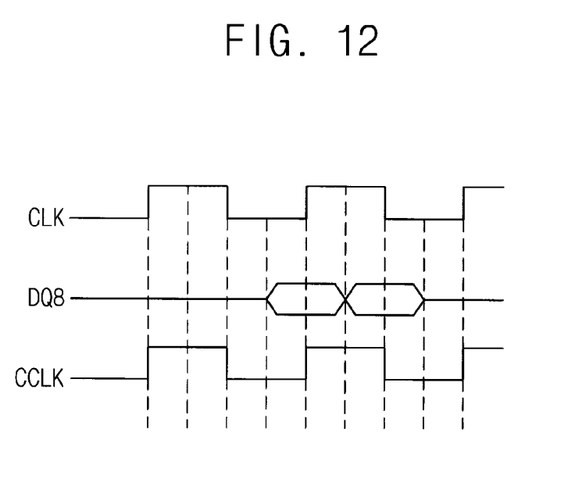
FIG. 12 is a schematic timing diagram illustrating operation of the memory system of FIG. 6 when there is no phase difference between the data clock signal and the read data, according to some exemplary embodiments.

FIG. 12 is a timing diagram illustrating operation of the memory system of FIG. 6 when there is no phase difference between the data clock signal and the read data.

Figure 13:
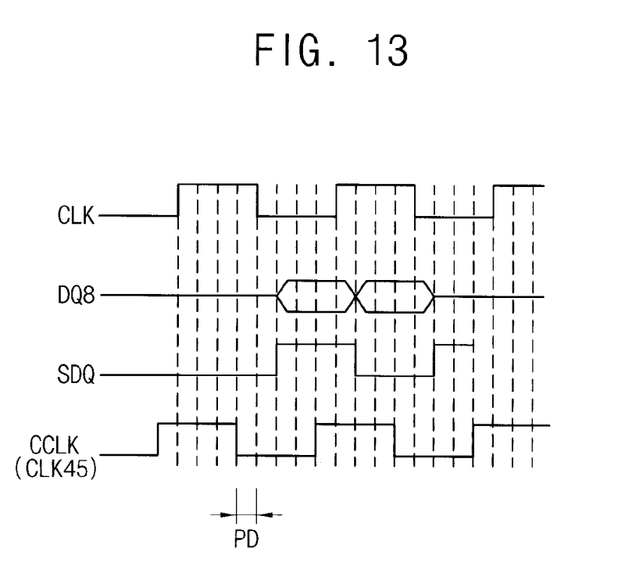
FIG. 13 is a schematic timing diagram illustrating operation of the memory system of FIG. 6 when there is a phase difference between the data clock signal and the read data, according to some exemplary embodiments.

FIG. 13 is a timing diagram illustrating operation of the memory system of FIG. 6 when there is a phase difference between the data clock signal and the read data.

Referring to FIG. 12, edges (rising edge and falling edge) of the data clock signal CLK are synchronized with a center of the read data DQ8. Therefore, the data clock signal CLK does not need to be adjusted, and thus the interpolated clock signal CLK0 is selected as the corrected data signal CCLK in the selection unit 241 in FIG. 9.

Referring to FIG. 13, skew between the edges of the data clock signal CLK and the read data DQ8 occurs. The phase of the data clock signal CLK is slower than the phase of the read data DQ8 by about 45 degree. Therefore, the sampler 170 in FIG. 6 samples the edge of the read data DQ8 to provide the sampled data SDQ. The phase detector 310 in FIG. 7 detects the phase difference PD by 45 degree between the edge of the sampled data SDQ and the data clock signal CLK. The converter 320 provides the phase information PHI such as "001" corresponding to the phase difference of 45 degrees to the phase interpolator 221. The selection unit 241 in the phase interpolator 221 selects the interpolated clock signal CLK45 of the interpolated clock signals CLK0, CLK45, . . . , CLK315 according to the phase information PHI such as "001". The transmitter 270 transmits the interpolated clock signal CLK45 as the corrected data clock signal CCLK to the memory device 500 as the data clock signal CLK through the pin 101. The memory controller 100 and the memory device 500 exchange data in synchronization with the interpolated clock signal CLK45.

Therefore, the memory system according to some exemplary embodiments prevents the system from being degraded by detecting the skew between the data clock signal and the read data to adjust the phase of the data clock signal CLK after the per pin data training.

Referring again to FIG. 6, the refresh controller 560 controls the refresh operation of the memory cell array 550, and the refresh controller 560 prevents skew between the data clock signal CLK and the read data due to the change of the memory device 500 and the change of the operating voltage of the memory device 500 when the memory cell array 550 exits from the self refresh operation. To prevent the skew, the refresh controller 560 transmits the predefined pattern PDP to the memory controller 100 through the representative pin 518 when the memory cell array 550 exits from the self refresh operation. The memory controller 100 receives the predefined pattern PDP through the representative pin 118, performs the CDR on the predefined pattern PDP, and determines whether the phase of the data clock signal CLK is adjusted. The CDR using the predefined pattern PDP may be pre-formed while the memory device 500 performs normal operations. The CDR using the predefined pattern PDP may be referred to as "short time training".

The exemplary embodiments are described such that the phase of the data clock signal CLK is synchronized with the read data using the phase interpolator 220. However, the inventive concept also applies to exemplary embodiments in which the data clock signal CLK is synchronized with write clock signal by the memory device 500 performing the CDR on the write data and detecting the phase difference between the data clock signal CLK and the write clock signal. In this case, the synchronization of the data clock signal CLK and the write clock signal is performed after the memory controller 100 performs per pin data training on write data, and one of the data pins is determined to be the representative pin.

The memory devices and the memory systems according to the described embodiments may be employed in various memory fields and applications because the system characteristics may be prevented from being degraded by using the detected phase difference between the data clock signal and the read data in adjusting phase of the data clock signal.

The foregoing is illustrative of exemplary embodiments and is not to be construed as limiting thereof. Although exemplary embodiments have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims.

What is claimed is:

1. A method of a non-transitory computer-readable storage medium tuning a phase of a clock signal, the method comprising:
performing data training on a plurality of data pins through which data are input and output, in synchronization with a data clock signal using a memory controller;
determining one of the data pins to be a representative pin using the memory controller;
performing clock and data recovery (CDR) on read data of the representative pin using the memory controller; and
adjusting a phase of the data clock signal based on the CDR using the memory controller,
wherein performing the CDR comprises:
sampling an edge of the read data to determine a sampled edge of the read data using a sampler in the memory controller;
detecting a phase difference of the sampled edge of the read data and the data clock signal using a decoder in the memory controller; and
adjusting the phase of the data clock signal according to the detected phase difference using a phase interpolator in the memory controller.

2. The method of claim 1, wherein the phase of the data clock signal is adjusted by synchronizing the data clock signal with the sampled edge of the read data.

3. The method of claim 1, wherein adjusting the phase of the data clock signal comprises:
converting the detected phase difference to phase information; and
selecting one of a plurality of interpolated clock signals according to the phase information, each of the plurality of interpolated clock signals having a same frequency as the data clock signal, the plurality of interpolated clock signals having regular phase differences with respect to each other.

4. The method of claim 1, wherein adjusting the phase of the data clock signal comprises:
converting the detected phase difference to phase information; and
calculating a plurality of interpolated clock signals using weights, the weights being determined according to the phase information, each of the interpolated clock signals having a same frequency as the data clock signal, the plurality of interpolated clock signals having regular phase differences with respect to each other.

5. The method of claim 1, wherein the data clock signal is one of a write clock signal and a data strobe signal.

6. A memory controller, comprising:
a sampler that samples an edge of read data from a representative pin selected from a plurality of data pins, such that a sampled edge of the read data is determined;
a decoder configured to decode a phase difference between the sampled edge of the read data and a data clock signal to provide phase information; and
a phase interpolator configured to adjust a phase of the data clock signal according to the phase information,
wherein the phase interpolator comprises:
a clock generator that generates a plurality of interpolated clock signals, each of the plurality of interpolated clock signals having a same frequency as the data clock signal, the plurality of interpolated clock signals having regular phase differences with respect to each other;
a weight generator that generates a weight for each of the interpolated clock signals in response to the phase information; and
a phase mixer that sums and averages the interpolated clock signals in response to the generated weights to provide the corrected data clock signal.

7. The memory controller of claim 6, wherein the decoder comprises:
a phase detector that detects the phase difference between the sampled edge of the read data and the data clock signal; and
a converter that converts the phase difference to the phase information.

8. The memory controller of claim 7, wherein the phase difference is a digital value.

9. The memory controller of claim 6, wherein the phase mixer includes a plurality of n-type metal oxide semiconductor (NMOS) transistors that receive the weights and the interpolated clock signals.

10. The memory controller of claim 6, wherein the weights correspond to currents.

11. The memory controller of claim 6, wherein the phase mixer comprises a plurality of differential input units.

12. A memory system comprising:
a memory device; and
a memory controller configured to exchange data with the memory device through a plurality of data pins in synchronization with a data clock signal, and configured to control the memory device, the memory controller comprising:
  a sampler that samples an edge of read data from a representative pin selected from the data pins, such that a sampled edge of the read data is determined;
  a decoder configured to decode a phase difference between the sampled edge of the read data and a data clock signal to provide phase information; and
  a phase interpolator configured to adjust a phase of the data clock signal according to the phase information,
wherein the memory device comprises:
  a memory cell array that stores the data;
  a refresh controller that controls refresh operation of the memory cell array; and
  a first in first out (FIFO) that stores predefined patterns,
  wherein the refresh controller controls the memory cell array such that the predefined patterns are transmitted to the memory controller through the representative pin after the refresh operation of the memory cell array is completed.

13. A method of a non-transitory computer-readable storage medium controlling a memory, comprising:
  sampling an edge of read data from a representative pin selected from a plurality of data pins used in communicating with the memory, such that a sampled edge of the read data is determined using a sampler;
  decoding a phase difference between the sampled edge and a data clock signal to provide phase information using a decoder; and
  adjusting a phase of the data clock signal according to the phase information using a phase interpolator,
wherein adjusting the phase of the data clock signal comprises:
  converting the detected phase difference to the phase information; and
  selecting one of a plurality of interpolated clock signals according to the phase information to provide a corrected data clock signal, each of the plurality of interpolated clock signals having a same frequency as the data clock signal, the plurality of interpolated clock signals having regular phase differences with respect to each other.

14. The method of claim 13, further comprising:
performing data training on the plurality of data pins through which data are communicated with the memory, in synchronization with a data clock signal; and
determining one of the data pins to be the representative pin.

* * * * *